United States Patent
Bernier et al.

(10) Patent No.: US 6,268,739 B1
(45) Date of Patent: *Jul. 31, 2001

(54) METHOD AND DEVICE FOR SEMICONDUCTOR TESTING USING ELECTRICALLY CONDUCTIVE ADHESIVES

(75) Inventors: William E. Bernier, Endwell; Michael A. Gaynes, Vestal, both of NY (US); Wayne J. Howell, Williston, VT (US); Mark V. Pierson, Binghamton, NY (US); Ajit K. Trivedi, Endwell, NY (US); Charles G. Woychik, Vestal, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/478,678

(22) Filed: Jan. 6, 2000

Related U.S. Application Data

(62) Division of application No. 09/050,820, filed on Mar. 30, 1998.

(51) Int. Cl.⁷ .................................................. G01R 31/02
(52) U.S. Cl. ............................................ 324/755; 324/765
(58) Field of Search .................................... 327/755, 765, 327/760; 438/14, 17, 18; 257/40, 48

(56) References Cited

U.S. PATENT DOCUMENTS 4,811,081  3/1989  Lyden .

(List continued on next page.)

FOREIGN PATENT DOCUMENTS

| 5-136146 | 6/1993 | (JP) . |
| 5-326628 | 12/1993 | (JP) . |
| 5-326629 | 12/1993 | (JP) . |
| 6-275678 | 9/1994 | (JP) . |
| 9-36119 | 2/1997 | (JP) . |

OTHER PUBLICATIONS

IBM Technical Disclosure Bulletin, vol. 32, No. 10B (Mar. 1990) pp. 474–477.
IBM Technical Disclosure Bulletin, vol. 33, No. 1A (Jun. 1990) pp. 124–125.
M. Nealon, "C4: A Legacy Technology for the Future", IBM MicroNews (1996).

Primary Examiner—Vinh P. Nguyen
(74) Attorney, Agent, or Firm—Ratner & Prestia

(57) ABSTRACT

A method and device for testing and burning-in semiconductor circuits. The method and device permit the entire wafer to be tested by temporarily attaching the wafer to a test substrate using electrically conductive adhesive (ECA). The ECA conforms to deviations from co-planarity of the contact points of both the wafer and test substrate while providing a quality electrical connection at each point. ECA material can be deposited on either the wafer contacts or the substrate pads. In addition, the ECA may be deposited on C4 bumps or tin-capped lead bases. Variations in the method and device include filling vias of a non-conductive interposer with ECA. The electrical connection may be enhanced by forming conductive dendrites on test pads while the ECA is deposited on the wafer contacts. To further enhance the electrical connection, the ECA material can be plasma etched to remove some of its polymer matrix and to expose the electrically conductive particles on one side and then plating with palladium. After the palladium-plated ECA is brought into contact with aluminum pads, palladium-coated aluminum pads, or even C4 solder bumps, conductive dendrites are formed on the palladium-treated ECA bumps.

9 Claims, 7 Drawing Sheets

U.S. PATENT DOCUMENTS

| | | |
|---|---|---|
| 5,007,163 | 4/1991 | Pope et al. . |
| 5,086,558 | 2/1992 | Grube et al. . |
| 5,420,520 * | 5/1995 | Ahschel et al. .................... 324/754 |
| 5,440,239 | 8/1995 | Zappella et al. . |
| 5,508,228 | 4/1996 | Nolan et al. . |
| 5,543,585 | 8/1996 | Booth et al. . |
| 5,545,465 | 8/1996 | Gaynes et al. . |
| 5,578,527 | 11/1996 | Chang et al. . |
| 5,578,934 | 11/1996 | Wood et al. . |
| 5,611,884 * | 3/1997 | Bearinger et al. ................... 156/325 |
| 5,625,298 | 4/1997 | Hirano et al. . |

\* cited by examiner

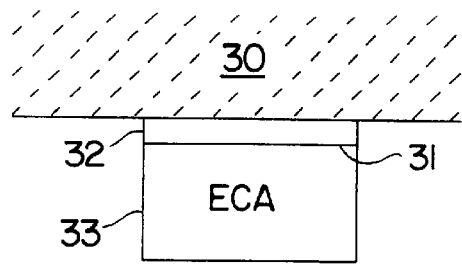
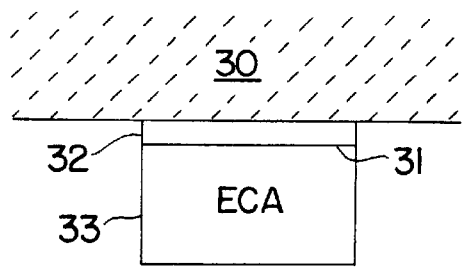
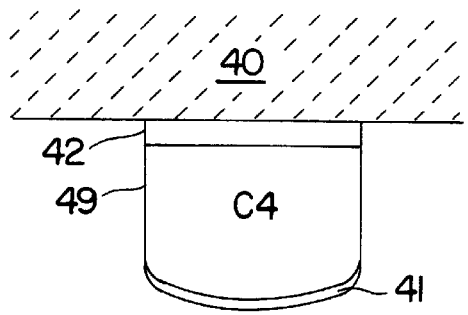
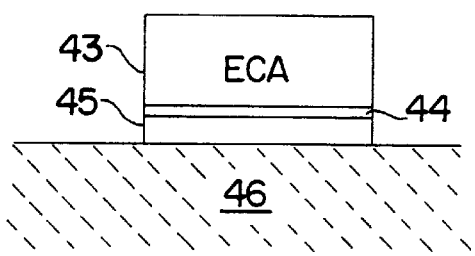
FIG. 5
FIG. 6
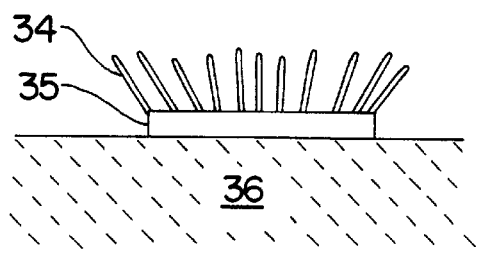
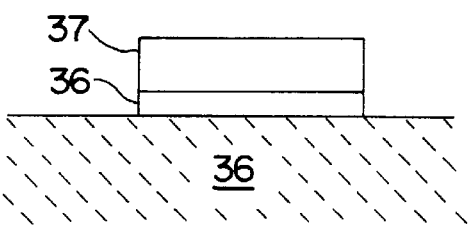
FIG. 7
FIG. 8

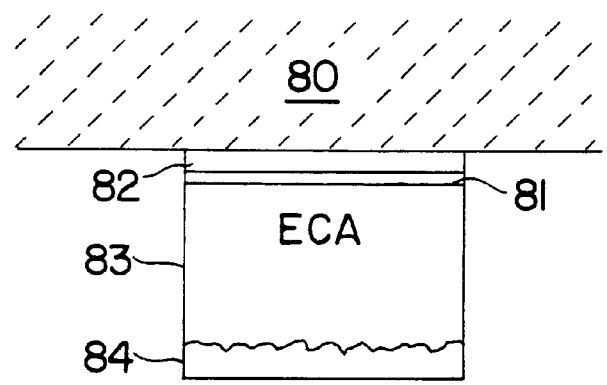
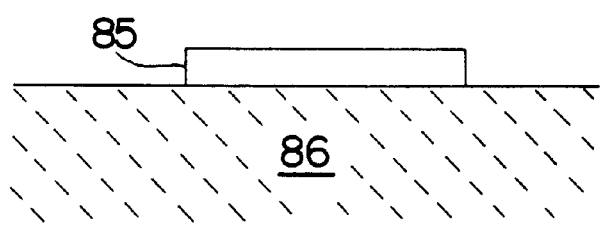
FIG. 11
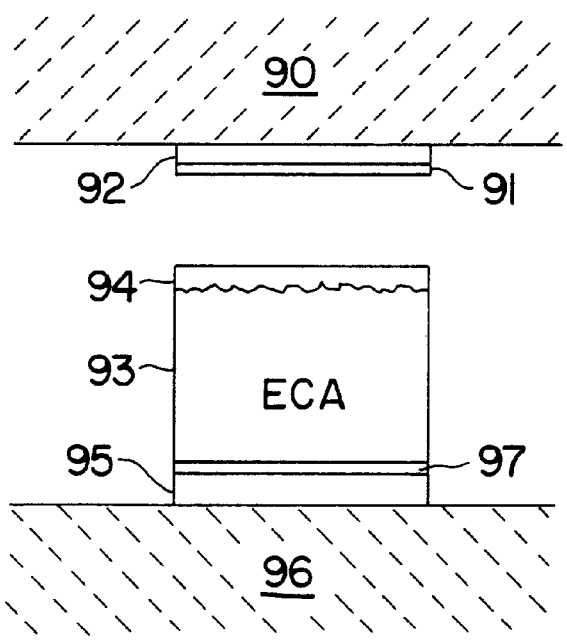
FIG. 12

METHOD AND DEVICE FOR SEMICONDUCTOR TESTING USING ELECTRICALLY CONDUCTIVE ADHESIVES

RELATED APPLICATION

This application is a divisional of U.S. patent application Ser. No. 09/050,820, filed on Mar. 30, 1998, which is pending.

The present invention is related to U.S. patent application Ser. No. 08/709,375 titled "Computer System With Photomask Screened Joining Material And Process," filed on Sep. 6, 1996 on behalf of M. Pierson et al., assigned to the assignee of the present application, and incorporated herein by reference.

GOVERNMENT RIGHTS

The U.S. Government has a paid-up license in the present invention and the right in limited circumstances to require the patent owner to license others on reasonable terms as provided for by the terms of Contract No. DE-FC04-94AL98817 awarded by the Defense Advanced Research Projects Agency.

TECHNICAL FIELD

The present invention generally relates to the testing of semiconductor chips and wafers and, more particularly, to a method and device for testing a chip or wafer without damaging contact points on the chip or wafer while providing a reliable electrical conductive path from each contact point on the chip or wafer to a corresponding point on a testing substrate.

BACKGROUND OF THE INVENTION

Most modern electronic systems include one or more integrated circuit (IC) chips bonded to a suitable substrate which, in turn, is connected to an electronic package such as a module, card, board, or gate. There are a variety of known techniques for connecting the chips to a substrate such as a circuit board. An overview of some of these techniques follows.

FIG. 1 shows one prior art technique for attaching an IC package 100 to a circuit board 105. In this particular case, the IC 110 itself is inside a plastic, dual, in-line package 100 having bent metal leads 115. (For convenience, an individual IC 110 is often referred to as a "die.") Wire leads 120 are used to connect the IC 110 to the bent leads 115 of the package 100. To mount the package 100, the leads 115 are inserted into matching holes 125 in the circuit board 105 and fixed in place by solder.

FIG. 2 shows another prior art technique of attaching an IC to a circuit board generally known as the "solder-bump" approach. In this technique, the die 110 has metal pads on which small bumps of solder 130 are deposited. The die 110 is aligned over matching metal pads 135 on the circuit board 105. When the assembly is heated to above the melting point of solder 130, the solder melts to form an electrical contact between the IC 110 and the circuit board 105. In this configuration, the die 110 is upside down from what is shown in FIG. 1. Thus, the configuration is also known as a "flip-chip."

Closely related to die connection technology is the increasing use of multi-chip module (MCM) design and packaging. In short, MCM techniques seek to combine a number of different dies on a common substrate. Benefits of MCM systems include increased operating clock speeds and reduced product footprint. Some in the semiconductor industry predict that as "real estate" (i.e., surface area) on IC devices continues to shrink, flip-chip bonding techniques will become dominant. Some of the benefits of the flip-chip bonding technique over wire bonding or tape automated bonding techniques—two other common die connection methods—are summarized in Table 1. Tape automated bonding is presently a preferred method of bonding dies to MCM-like substrates.

TABLE 1

Comparison of Typical Die Connection Characteristics

|  | Flip-Chip | Wire Bonding | Tape Automated Bonding |
| --- | --- | --- | --- |
| Resistance (Ohms) [smaller is better] | 0.002 | 0.030–0.035 | 0.020 |
| Inductance (nH) [smaller is better] | 0.200 | 0.65 | 2.10 |
| Capacitance (pF) [smaller is better] | 0.001 | 0.006 | 0.040 |
| Example Bond Size, one side (mils) [smaller is better] | 400 | 472 | 520 |

As shown in Table 1, the flip-chip technique requires less bonding area (for a given size die, e.g., 400 mils on a side) than do either wire or tape automated bonding methods. This advantage allows, in turn, for an increased packing density of dies on an MCM substrate. Flip-chip bonding also provides lower levels of resistance, capacitance, and inductance per contact than do the other methods. All of these features support increased operational speeds.

A significant problem in assembling MCM systems, or other multi-die circuits, is that dies purchased from silicon foundries usually cannot be assumed to be 100% "good" (i.e., functional). In a large multi-die circuit, the probability that a completed circuit will contain all good dies decreases exponentially as the number of dies increases. A significant problem for companies that assemble dies into circuits, e.g., system houses, is that of testing purchased dies to ensure that they are in fact good.

From the point of view of the system house, the problem is being able to obtain dies that are "known good" so that the system house does not have to incur the cost of testing each purchased die. On the other hand, silicon foundries make their money in running wafers and often do not want to perform costly functional testing. (A plurality of chips or dies are formed on a single wafer, during semiconductor manufacturing, which is then diced.) Many silicon foundries might be willing to perform, at most, a worst-case DC test at the wafer level.

If a system house avoids testing in manufacturing a one-hundred die MCM, for example, and any one or more of the dies are bad, the system house incurs the added costs of fault isolation and die removal and replacement—a possibly time-consuming and costly endeavor. Because of the costs of these operations, all of the forward-thinking semiconductor companies are now developing capabilities to perform bare die testing in preparation for flip-chip applications.

In semiconductor manufacturing, after a plurality of chips are formed on a wafer, each of the chips are commonly probed in sequence to initially check certain of their electrical characteristics. Following this initial probing, the wafer is diced, then packaged and subjected to a burn-in acceleration test to remove those products subject to initial failure. This acceleration test simulates long-time performance by operating a circuit at an elevated temperature (typically about 150° C.) while selected signal patterns and sequences are applied to the circuit. As MCM designs become more prevalent, new ways to conduct burn-in tests become more urgent, especially because replacement of faulty chips in an MCM is difficult to automate and a reworked MCM is typically not as reliable as an MCM which was not reworked. Disposal of an MCM having a single faulty chip is costly and, therefore, is not a desirable solution.

The processes of mounting individual dies to substrates or sequentially testing individual chips before they are diced are time consuming and costly alternatives. A considerable amount of time can be saved by testing an entire wafer at once. Accordingly, such all-encompassing tests are desirable.

These tests usually incorporate a test probe. One type of conventional test probe has a plurality of fixed needles mounted on respective cantilevered tungsten wires supported on an epoxy substrate. The wires are connected to an external tester and the needles are brought into contact with respective ones of the chip input/output (I/O) pads. Thus, the needles serve as contact electrodes. This needle and cantilevered wire arrangement, although used for many years in the semiconductor industry, is not suitable for high-density products. It has also been found that, when the chip under test is heated during burn-in testing, thermal expansion differences between the needles, the cantilevered wires, and the chip prompt the needles to shift from their original position. This thermal shifting is especially exaggerated when the chips are being tested in wafer (i.e., un-diced) form and can cause false readings or inputs. Thus, this probe technology is ill-adapted for reliable burn-in testing before dicing.

One attempt to meet the new requirements of testing MCM technology was disclosed by U.S. Pat. No. 5,625,298 issued to Hirano et al. (discussing T. Tada et al., "A Fine Pitch Probe Technology," 1990 International Test Conference, pages 900–06). In this attempt, probe contact electrodes were formed on the surface of a glass board by a lithographic technique. Each contact was electrically connected to an external tester via a respective conductive via passing through a hole on the board. The metal contact electrodes are stiff, however, and do not allow for significant—although small—variations in the co-planarity of the wafer contacts. Consequently, the metal contact electrodes cannot compensate for small variations in the thickness of wafer metallizations or substrate pads, or perturbations in the surface of a wafer or substrate, not to mention solder bumps. Moreover, the process to manufacture was found to be complicated and costly.

One prior attempt to resolve this compensation problem is disclosed By E. Klink et al. in "High-Performance Test System," IBM Technical Disclosure Bulletin, Vol. 33, No. 1A, pages 124–25 (June 1990). The article teaches applying lead-tin C4 (Controlled Collapse Chip Connection) solder bumps to the wafer pads and forming conductive copper dendrites on corresponding pads formed on a silicon carrier. The two silicon parts have substantially flat surfaces. Consequently, all chip positions can be contacted in parallel and, compared with standard needle contacts, only a minimum of compressive force is required.

Commonly assigned U.S. Pat. No. 5,420,520, issued to Anschel et al., teaches a method of testing chips using a conductive dendrite contact. FIG. 3 (which corresponds to FIG. 4 of the patent) shows a cross-sectional schematic representation of a burn-in board 140 having dendritic contacts 138 aligned with C4 bumps 142 formed on a chip 110. A problem with this method is that the conductive dendrite contacts 138 leave indentations in the C4s after their removal, and the C4 bumps 142 have to be reflowed following the testing procedure. The added expense and time required to reflow the C4 bumps 142 are undesirable; the present invention renders this step unnecessary.

In an effort to reliably test integrated circuit chips and at the same time prepare them for assembly in an MCM, U.S. Pat. No. 5,440,239 issued to Zappella et al. discloses a method of forming a Transferable Solder Bump (TSB) on a test substrate. As shown in FIG. 4, which corresponds to FIG. 3 of the patent, die 110 has an aluminum pad 150 through which electrical connections can be made. The test board or substrate 160 includes an electrical-contact pad, such as an aluminum pad 170, and a TSB stack 180. The TSB stack 180 is made up of a number of metallization layers: a vapor-deposited protected conductor layer 182 comprised of chromium; a solder bump 184 comprised of tin, lead-tin, an indium solder alloy, or various other alloys depending on the target melting point; a diffusion layer 186 comprised of copper or a nickel-copper alloy; and a top layer 188 of gold that eventually forms a permanent contact with the aluminum pad 150 of the die 110.

The test device 190 is bonded to the die 110 through thermal compression or thermalsonic techniques. As the name implies, thermal compression bonding uses compression and heat to form a bond between the gold layer 188 and the aluminum pad 150 of the die 110. Thermalsonic bonding techniques use compression, heat, and ultrasonic energy to introduce a scrubbing action between the gold layer 188 and the aluminum pad 150 of the die 110. Once bonded, the test device 190 is plugged into a test jig for testing. If the die 110 proves to be reliable, the die 110 is removed from the substrate 160, with gold layer 188, diffusion layer 186, and solder bump 184 intact, by elevating the air temperature and allowing the chromium layer 182 to oxidize. Thus, the tested die 110 is provided with solder bumps 184 and is ready for incorporation into an MCM or other package.

A problem with this method is that the pads, solder bumps, and associated metallic layers do not provide a sufficient margin of error along the Z-axis for testing an entire wafer. Furthermore, the method requires many steps, including the costly step of vapor deposition of the chromium layer 182. In addition, "bad" dies 110 are discarded along with the testing module and substrate, which entails a-further expense in lost materials.

U.S. Pat. No. 5,611,884, issued to Bearinger et al., discloses an Electrically Conductive Adhesive (ECA) material containing silicone resin, siloxane gum, and a conductive particulate material. The composite exhibits properties of electrical conductivity and a tacky surface. FIGS. 3A–3C of this patent show a method of attaching and detaching a chip having C4 bumps formed on its contacts to and from a substrate using the ECA material. The conductive particulate material of the ECA material may be spherical gold particles; spherical, hollow glass microspheres coated with silver, gold, nickel, or copper; or spherical particles of metal alloys such as tin-copper, lead-tin, and gold-tin.

The conductive particulate materials disclosed by Bearinger et al. have several disadvantages, including the spherical shape of the conductive particulates, the relatively high cost of some of the materials (e.g., gold), and the relatively strong adhesion provided by some of the materials (e.g., lead-tin solder). Alternative shapes such as flakes, rather than spheres, might be advantageous in certain applications. Cost savings are always desired. Weaker adhesion would allow cleaner separation between the ECA material and the substrate and, at least in some applications, would be preferred. It would also be advantageous to increase the surface area of contact between is the ECA material and the substrate to which it is attached (e.g., by using dendrites) and to increase the conductivity of the ECA material.

The known art has failed to provide a mechanism for rapid, reproducible, low cost, high throughput testing of integrated circuit chips. To overcome the shortcomings of the conventional mechanisms, a new method and device are provided. An object of the present invention is to provide a method and device for testing a chip or wafer having a two-dimensional array of electrical contacts by providing temporary attachment to a substrate having corresponding contacts without unduly increasing the number of steps required to prepare the chip for attaching it to its final assembly. It is further an object of the present invention to provide a method and device for reliably testing and/or burning-in an array of chips in a wafer by providing a reliable, simultaneous electrical connection between each electrical contact on the wafer and a corresponding electrical contact on a test substrate. Still another object of the present invention is to provide a method and device that allow easy chip positioning and temporary attachment and easy removal of chips after testing. A related object is to fill the need for an efficient testing mechanism which can easily and readily feed an MCM-like manufacturing process.

SUMMARY OF THE INVENTION

To achieve these and other objects, and in view of its purposes, the present invention provides a method and device for testing a chip or wafer without damaging contact points on the chip or wafer while providing a reliable electrical conductive path from each contact point on the chip or wafer to a corresponding point on a testing substrate. A first embodiment of the method of the present invention, which tests a semiconductor chip using a separable connection, includes the steps of: (1) providing a semiconductor chip having contact pads located in an arrangement on a surface of the semiconductor chip, (2) dispensing and curing an electrically conductive adhesive (ECA) material on the contact pads, (3) providing a test substrate having conductive test pads located on a surface of the test substrate in a mirror image pattern corresponding to the arrangement of the contact pads, (4) optionally forming conductive dendrites or gold-plated copper pads on the test pads, (5) aligning the wafer with the test substrate, (6) moving the wafer and the test substrate together and applying a predetermined force causing the ECA material to conform to the variance in the wafer pads, (7) testing the wafer, (8) removing the force and separating the ECA material from the test pads, (9) applying a solvent to dissolve the ECA material from the contact pads of the wafer, and (10) applying ECA material again or adding solder to the wafer.

A second embodiment of the invention includes the method steps of (1) flowing C4s onto wafer pads, (2) depositing ECA material onto the substrate pads, (3) moving the wafer and the substrate together and applying a predetermined force so that the ECA material conforms to the C4 bumps, (4) testing the wafer, and (5) washing the ECA material off the substrate, thereby readying the C4s for attachment into a final assembly.

A third embodiment of the method of the present invention includes the steps of (1) flowing C4s onto wafer pads; (2) positioning a non-conductive interposer between the wafer and the substrate so that vias in the interposer are aligned with the contacts on the wafer and substrate, the vias being filled with ECA material; (3) moving the wafer and is the substrate together and applying a predetermined force so that the ECA material conforms to the C4 bumps and pads of the substrate; (4) testing the wafer; and (5) removing the interposer, thereby readying the C4s for attachment into a final assembly.

A fourth embodiment of the method of the present invention includes the steps of (1) providing a lead base on the wafer at each contact point; (2) applying a gold-tin cap, e.g., through a sputtering process, to each lead base; and (3) then adhering an ECA bump to each gold-tin cap. The wafer and substrate are then (4) aligned and forced together with a predetermined pressure. After the wafer is tested, the ECA bump then (5) is removed and the contacts are prepared for final assembly. A modification of this embodiment replaces the lead base with standard C4 solder bumps and ECA material is adhered to the C4s. The wafer and substrate are aligned, then forced together with a predetermined force and tested.

Another method of testing wafers is contemplated in which a finished wafer with aluminum wire bond pads is treated with zincate, nickel, and gold to prepare the metal surface for bonding to a thermoplastic, electrically conductive adhesive and to provide an excellent electrical interface. The ECA is applied, for example, using a photobumping process. The resulting ECA bumps are plasma-etched to roughen the surfaces of the bumps, to create a high surface area contact, and to expose some of the conductive particles by etching away some of the polymer matrix. Palladium is then plated on the roughened surface of the ECA. The wafer is then brought into contact with plated palladium pads on a glass ceramic carrier surface acting as the test probes and dendritic palladium contacts are formed between the palladium probes and the ECA bumps on the wafer pads. After the electrical connection is made, the wafer is tested and known good die are identified. On completion of the testing, the ECA bumps are stripped by wet processing with a solvent such as ethyl benzoate, leaving a gold surface exposed. After dicing, the dies identified as good may be bonded into packages using gold wire.

The above method can be modified by applying the ECA bumps to the test probe fixture instead of to the wafer. In this case, the probe pads are bumped with ECA material which is then plasma etched and plated with palladium. The probe and wafer are then brought together for testing. The resulting structure provides a test probe interface which is mechanically compliant to accommodate tolerances of the probe carrier, ECA bump heights, and wafer contact tolerances and which is capable of forming a high-quality electrical interconnection due to the palladium dendrite growth from the ECA bump surface into the target wafer contact surface.

The above method can be further modified for use with C4 bump wafer processing as follows. After the ball limiting metallurgy (BLM) is deposited on the wafer pads, ECA bumps are formed in place of the C4s. The bumps are plasma etched to roughen the surface and expose the conductive particles. Palladium is then plated on the ECA bump. A test probe having palladium pads on a carrier (formed of glass ceramic, silicon quartz ceramic, or similar material) is brought into contact with the plated ECA bumps on the wafer. Palladium dendrites are formed between the contacts to enhance the electrical contact of the test probe to the compliant conductive bumps. After testing, the die can be diced and assembled to circuit packages using the ECA flip chip attach assembly process or to a chip carrier or board assembly. Alternatively, the ECA bumps can be stripped using a wet process solvent such as ethyl benzoate after which the wafer can be bumped using standard bump metallurgy, diced, and picked yielding the good die and assembled using an appropriate C4 circuit package.

Standard wafers bumped with 97-3 lead-tin can be tested with this approach as well. The mating ECA-bumped test probe carrier pads are brought into intimate contact with the solder-bumped wafer. Dendritic palladium contacts are formed between the palladium-plated ECA bumps of the test probes and the solder bumps on the wafer, allowing a continuous electrical path to form. The fixturing pressure at the contact is such that the resiliency of the ECA material is retained and the solder bump on the wafer is not mechanically damaged. When testing is complete, the interface can be easily separated and the test probes can be reused. The C4 wafer may be cleaned if desired and the wafer can proceed to normal subsequent processing such as dice, pick, and assembly.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 5 illustrates a device according to a first embodiment of the present invention, including a test substrate having test pads with dendrites used to electrically and mechanically engage an electrically conductive adhesive (ECA) material which is applied to the chip pads of the wafer to be tested;

FIG. 6 illustrates a device according to a second embodiment of the present invention, including a test substrate having test contacts with gold-plated copper pads used to electrically and mechanically engage an ECA material which is applied to the chip pads of the wafer to be tested;

FIG. 7 illustrates a device according to a third embodiment of the present invention, including a test substrate having test pads with an ECA material used to electrically and mechanically engage a C4 ball which is applied to the chip pads of the wafer to be tested;

FIG. 8 illustrates a device according to a fourth embodiment of the present invention, including (a) a test substrate having test pads, (b) an interposer having vias filled with an ECA material, and (c) a C4 ball which is applied to the chip pads of the wafer to be tested;

FIG. 11 illustrates a device according to a seventh embodiment of the present invention, including a test substrate having test pads used to electrically and mechanically engage the palladium dendrites formed on an ECA material which is applied to the chip pads of the wafer to be tested;

FIG. 12 illustrates a device according to an eighth embodiment of the present invention, including a test substrate having test pads on which are formed palladium dendrites atop an ECA material, with the dendrites used to electrically and mechanically engage the chip pads of the wafer to be tested;

DETAILED DESCRIPTION OF THE INVENTION

Figure 1:
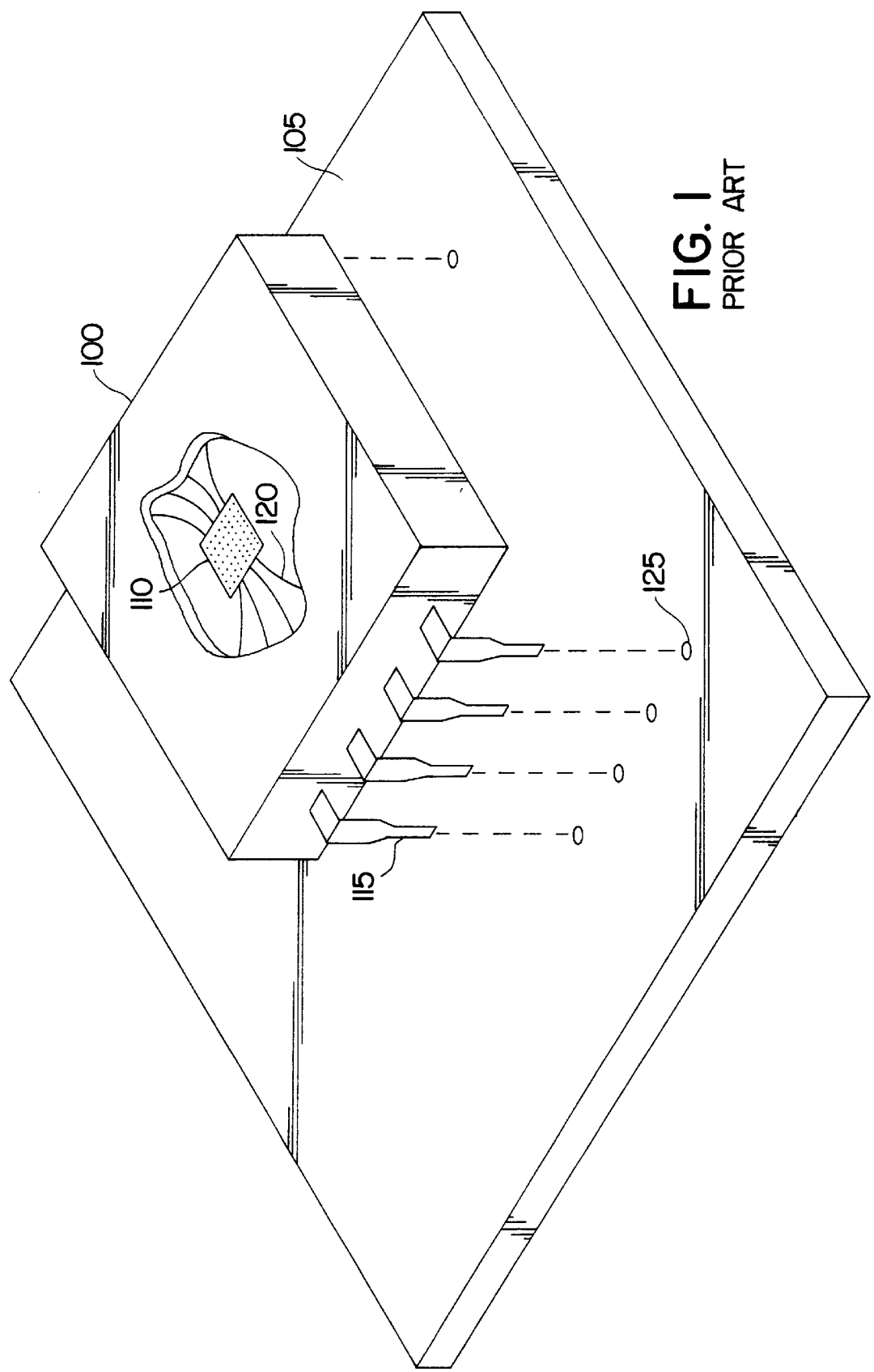
FIG. 1 illustrates how a dual, in-line package is typically attached to a circuit board, as disclosed in U.S. Pat. No. 5,440,239.
Figure 2:
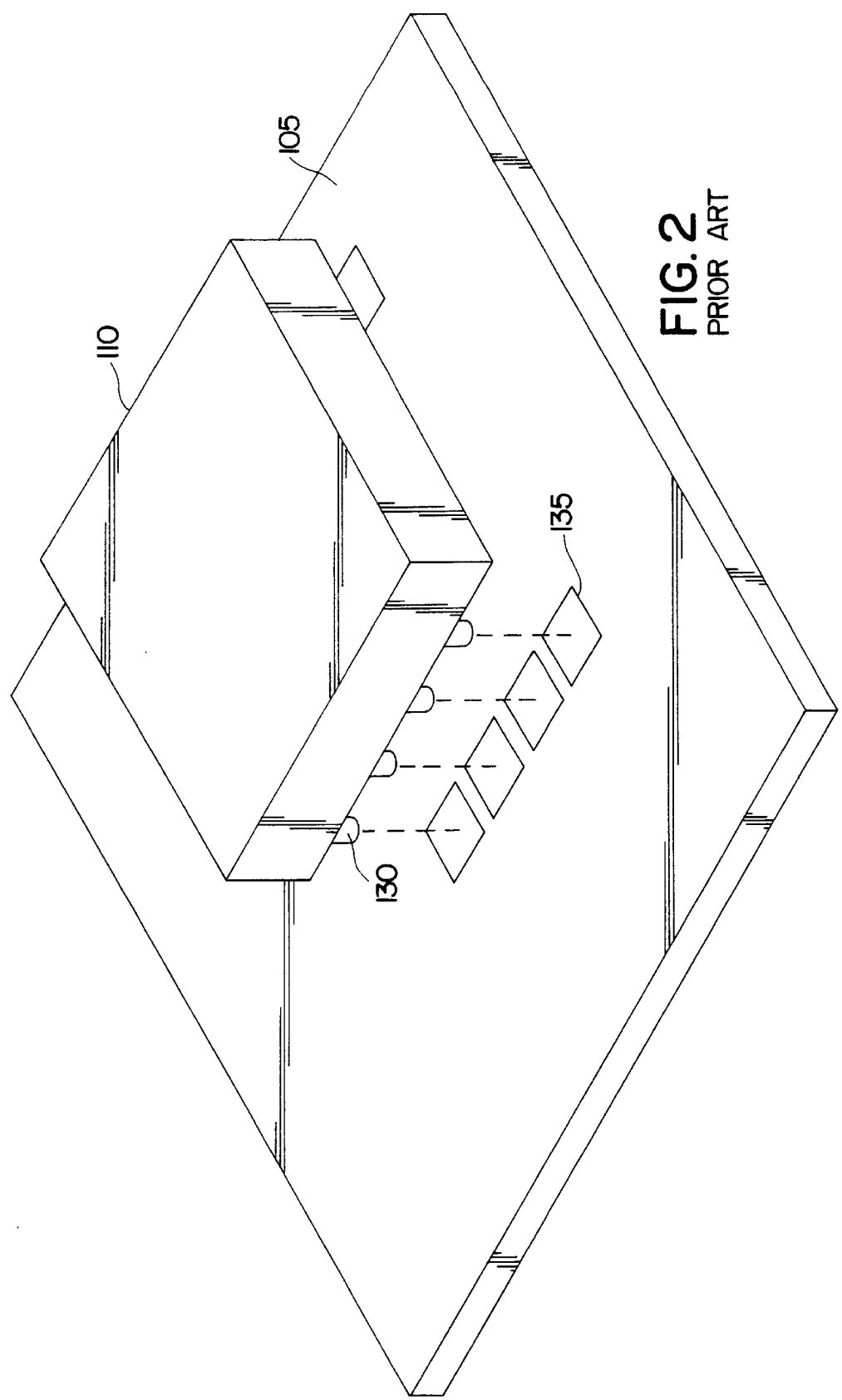
FIG. 2 illustrates how the flip-chip solder bump technique can be used to attach a semiconductor die to a circuit board, as disclosed in U.S. Pat. No. 5,440,239.
Figure 3:
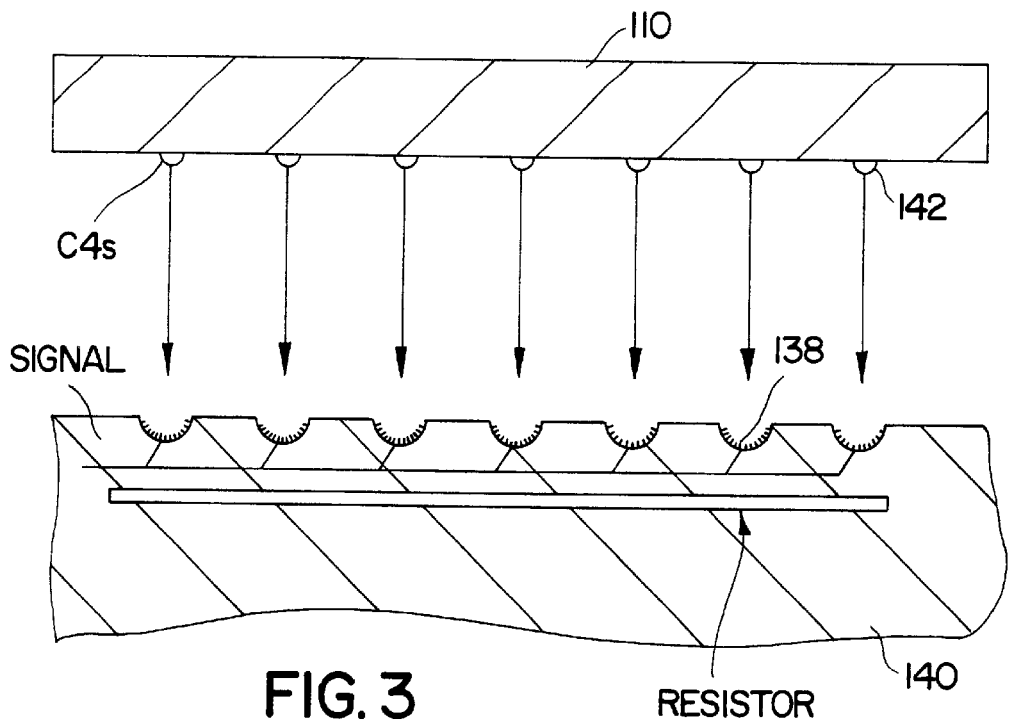
FIG. 3 is a prior art schematic representation of a connection between an integrated circuit chip and a test/burn-in board as disclosed in U.S. Pat. No. 5,420,520.
Figure 4:
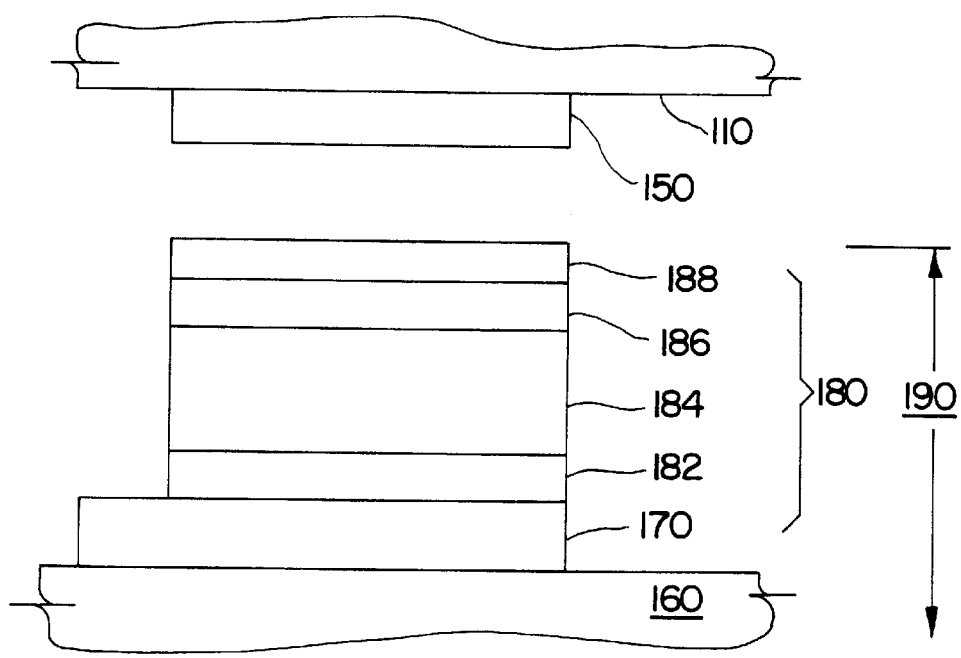
FIG. 4 is a prior art schematic representation of a connection between an integrated circuit chip and a test/burn-in board as disclosed in U.S. Pat. No. 5,440,239.

Because there are so many test points on a wafer, and the connections between the test module and the test points must be electrically sound, metals have been used to form the connections. But metals are stiff, by nature, and do not permit much variation in the vertical or Z-axis. Electrically conductive adhesive (ECA) materials are conductive, flexible, and can be dispensed to form the small features demanded by C4 technology. The present invention incorporates such ECA materials to achieve these advantages.

Typically, ECA materials are formed from a thermoplastic component dissolved in an organic solvent. The preferred ECA incorporates a polyimide-siloxane thermoplastic because of its high temperature stability, high adhesion, mechanical strength, elasticity, and high solubility in organic solvents. The solvent may include n-methylprilodone, xylene, and more preferably acetophenone. An oxygen scavenger or other type of deoxidizer may be added to the dissolved thermoplastic to improve the connection between particles during curing. Flux components such as the oxygen scavenger should be the "no-clean" type of fluxes which vaporize or leave an inert residue after curing. Although most have not been tested with the present invention, flux components that may be useful include abietic acid, adipic acid, ascorbic acid, acrylic acid, citric acid, maleic acid, polyacrylic acid, or other organic acids with an electron-withdrawing group such as fluorine, chlorine, bromine, iodine, sulfur, nitrile, hydroxyl, or benzyl groups.

Silver flakes are formed by mechanically flattening silver particles in a press to produce a powder containing a high ratio of flakes to particles. (Alternatively, copper flakes may be used.) The particles may be suspended in an expanding air flow to categorize them by air resistance. Then the air-resistance categorized particles are sorted by size to separate flakes from much smaller compact particles. The flakes are mixed into the dissolved thermoplastic until sufficient to form an isotropically conductive joining ECA material during subsequent curing. Silver flakes have a very low percolation threshold at which time the material switches from a high-resistance material to a very low-resistance material. The theoretical percolation threshold for silver flakes that are three times as wide as they are thick is only about 16% by volume (about 25% by weight). More preferably, the ECA material has as many particles as allowed for screening. The preferred range is about 60 to about 90% silver flakes by weight, more preferably about 70 to about 85% silver flakes. Preferably, the average width of the flakes is at least two times and more preferably three times the average thickness of the flakes. Although the preferred ECA material has been described as a polyimide-siloxane thermoplastic dissolved in an organic solvent with silver flakes mixed into the dissolved thermoplastic, the present invention can use a commercially available ECA such as the materials marketed under the trade names Diemat and Staystik.

Although ECA materials bond well to a variety of substances, it has been discovered that such materials bond best to noble metals. Accordingly, a coating of noble metal may be required on the surface of the component to which the ECA material will bond to assure reliable connection using either thermoplastic or thermoset ECA materials. The noble metal may be gold, silver, platinum, or palladium. A nickel-gold alloy may be preferable.

The ECA material may be applied, through a process called "photobumping," to a semiconductor wafer using a screening machine with a screening head and nozzle. First, the thermoplastic material is dissolved in the organic solvent. Silver particles are formed, optionally coated with gold, and mixed into the dissolved thermoplastic until the paste (which is the consistency of toothpaste) is isotropically electroconductive. Next, provided are the following components: a semiconductor wafer with a photoresist coating having holes exposing gold pads; a screening head with a piston and an elongated nozzle; a screening machine to move the head; a source of pressurized air; and a holder to seal the nozzle.

The wafer is placed in a fixture and located in the screening machine. The nozzle is lowered in the Z-direction and a certain amount of force is applied to keep blades in intimate contact with the photoresist on the wafer. The blades are thin to conform to the photoresist surface without leaking. Pneumatic pressure is applied through an aperture to the piston and, therefore, the ECA material is forced through the blade openings and into the holes formed in the photoresist. The screening machine moves the nozzle laterally. The ECA material is forced into the holes in the photoresist as the nozzle travels over the features of the wafer. If several passes are needed, the screening machine stops and reverses direction and returns to its original position.

More specifically, paste is introduced into the enclosure below the piston, the nozzle is unsealed by lifting it from the holder, the nozzle is moved to and placed on the planar surface of the photoresist, pressurized air is introduced above the piston to pressurize the paste, the nozzle is moved laterally across the surface then moved in the opposite direction, air above the piston is depressurized to depressurize the paste, and the nozzle is lifted off the surface. The nozzle may then be rotated (e.g., ninety degrees) and returned to the surface to repeat application of the paste. Finally, the nozzle is moved to the holder and sealed by pressing down on the holder.

Referring now to the figures of the drawing which illustrate the present invention, in FIG. 5 the wafer 30 has had ECA bumps 33 dispensed and cured on the precious metal layer 31 on chip pads 32. The test substrate 36 has conductive test pads 35 that each have conductive dendrites 34. Test pads 35 may be made of copper. Dendrites 34 are essentially vertical members extending outwardly from a generally planar area of electrically conductive material such as test pads 35. The dendrites 34 may be produced by a columnar growth process and generally have an aspect ratio, of vertical to horizontal dimensions, of at least about 3:1 to 12:1. The height of the dendrites 34 above the planar area of test pads 35 is typically about 5 to 20 micrometers.

Dendrites 34 are high-surface area connectors. One suitable structure for dendrites 34 is (1) a smooth, thin-film, underlayer of, for example, palladium; and (2) a porous, columnar palladium overlayer. Optionally, a gold layer may be placed atop the porous palladium layer for bonding. Such dendrites are disclosed in U.S. Pat. No. 5,420,520. Alternatively, as shown in FIG. 6, gold plated copper pads 37 can be formed on the test pads 35 instead of dendrites 34. The ECA material bonds well to a variety of substances, especially noble metals such as gold and palladium; palladium dendrites 34 allow the underlying ECA material to bond well to even more substances.

To test the entire wafer 30, an alignment is performed between wafer 30 and test substrate 36. The two components are moved together and a predetermined force is applied. The pressure (e.g., 100 to 200 psi) may be applied at elevated temperatures (e.g., 200 to 240° C.) and for a specific time (e.g., 5 to 240 seconds). The ECA bumps 33 of FIG. 5 conform to the variances in wafer chip pads 32 and substrate test pads 35. After testing is completed, a solvent is applied to dissolve and remove the ECA material from the wafer 30. Thus, removal of the tested wafer 30 from the test substrate 36 is possible. ECA material can again be applied to wafer 30 or 97-3 lead-tin solder can be added before the wafer is prepared for normal dicing and picking.

The ECA 33 remains flexible and will readily stick to a substrate 36 whether the substrate 36 is flexible or rigid, thus minimizing stress on the chip pads 32 which may arise from any differences in the coefficient of thermal expansion between the chip pads 32 and the substrate 36. The ECA 33 may be applied by any suitable mechanism, including rolling or spreading. The ability of the ECA material to conform to variances in the Z-axis allows an entire wafer 30 to be tested at once. In addition, because the testing operation occurs before depositing C4s on the wafer 30, two reflowing operations of the C4s, before and after testing, are not necessary.

The test module can be designed to allow 100% functional testing of the die as well as burn-in. Dies that successfully complete the test and burn-in process are considered to be "known good dies." Finally, a solvent is applied to remove the known good die from the test device which can then be used immediately in a flip-chip configuration and affixed to an MCM or other circuit board.

FIG. 7 shows another embodiment of the present invention in which ECA bumps 43 are deposited on conductive test pads 45 of test substrate 46. A thin precious metal layer 44 is provided on conductive test pads 45. C4 balls 49 are provided on chip pads 42 of wafer 40. A thin precious metal layer 41 is provided on C4 balls 49. Wafer 40 and test substrate 46 are aligned and forced together for testing. During this process, the ECA material conforms to C4 balls 49 of wafer 40 without damaging them. After testing, the ECA material 43 is washed off the test substrate 46 with a solvent. The wafer 40, with prepared C4 balls 49, then is ready for immediate dicing and picking. The process step of reflowing C4 balls 49 is unnecessary because they are not damaged by the ECA bumps 43; C4 balls 49 are not indented by the material of ECA bumps 43. Thin precious metal layer 41 will be absorbed into reflowed solder when it is joined to a substrate or card.

In FIG. 8, the ECA material is provided as ECA slugs 53 which reside in vias 51 of a non-conductive interposer 58. Vias 51 are aligned with C4 balls 59 which are provided on chip pads 52 of wafer 50. A thin precious metal layer 54 is provided on C4 balls 59. Wafer 50, non-conductive interposer 58, and test substrate 56 (which has test pads 55 and a thin precious metal layer 57) are aligned and then forced together with a predetermined force. The ECA material 53 conforms to both C4 balls 59 and test pads 55, forming a secure electrical connection during the test procedure. After testing, the wafer 50 and test substrate 56 are easily separated. Test substrate 56 and non-conductive interposer 58 can be reused.

Figure 14:
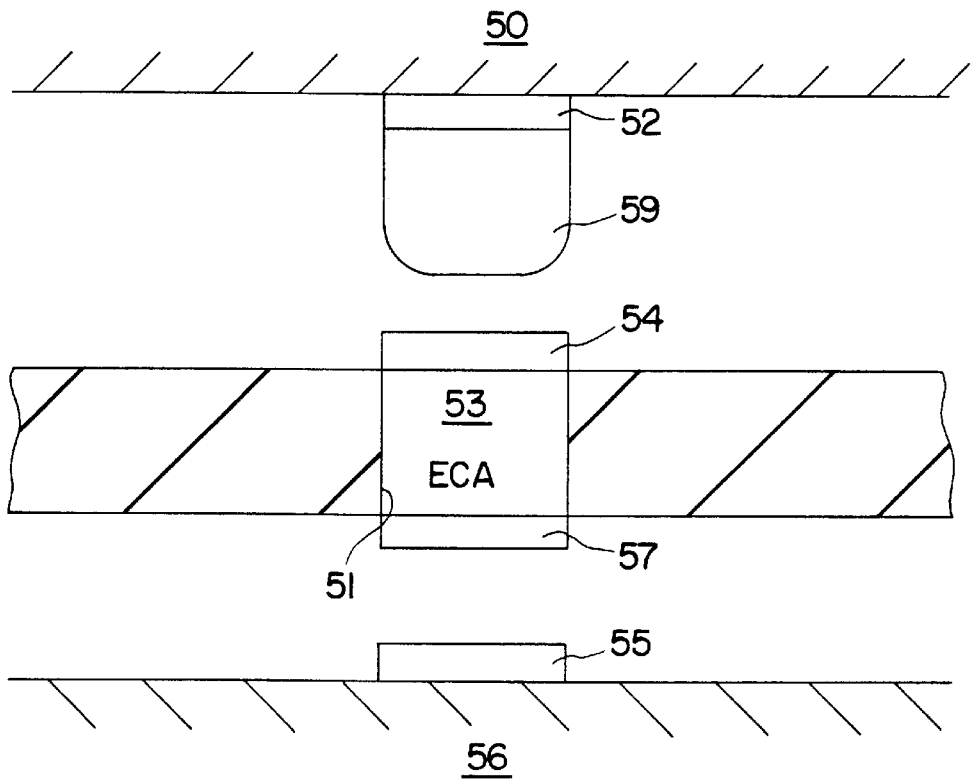
FIG. 14 illustrates a device similar to the fourth embodiment of the present invention illustrated in FIG. 8, but with an alternative arrangement of the thin precious metal layers.

Alternatively, as shown in FIG. 14, thin precious metal layers 54, 57 may be disposed directly on the faces of ECA slug 53 which resides in via 51 of non-conductive interposer 58. The material used to form ECA slug 53 in this alternative embodiment preferably has more silicone, to enhance resiliency and provide higher resistance, than does the ECA material of other embodiments. Dendrites, such as dendrites 34 illustrated in FIG. 5, might be disposed directly on the faces of ECA slug 53 rather than thin precious metal layers 54, 57.

Figure 9:
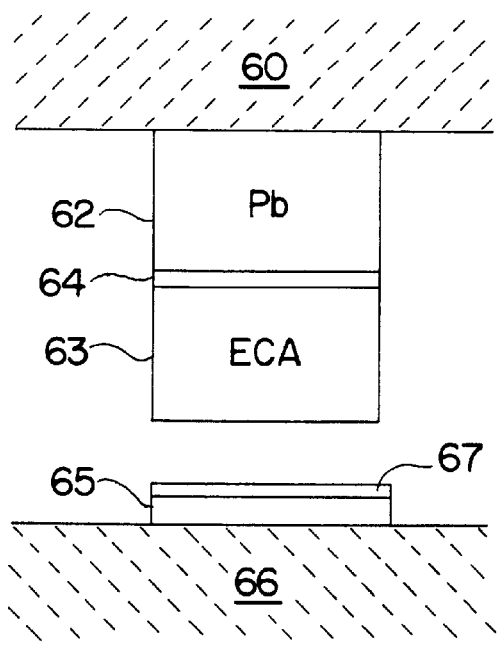
FIG. 9 illustrates a device according to a fifth embodiment of the present invention, including a test substrate having test pads used to electrically and mechanically engage an ECA material which is applied, through a gold-tin cap and lead base, to the wafer to be tested.

In FIG. 9, the wafer 60 has a plurality of lead is bases 62 which have thin tin or precious metal caps 64. ECA bumps 63 are disposed on the caps 64 of respective lead bases 62. The caps 64 are applied using a sputtering process, after which the ECA bumps 63 are added. Before the test procedure, the wafer 60 and test substrate 66 (which has test pads 65 and may also have a thin precious metal layer 67) are aligned and forced together to provide a good electrical connection at each contact point.

Figure 10:
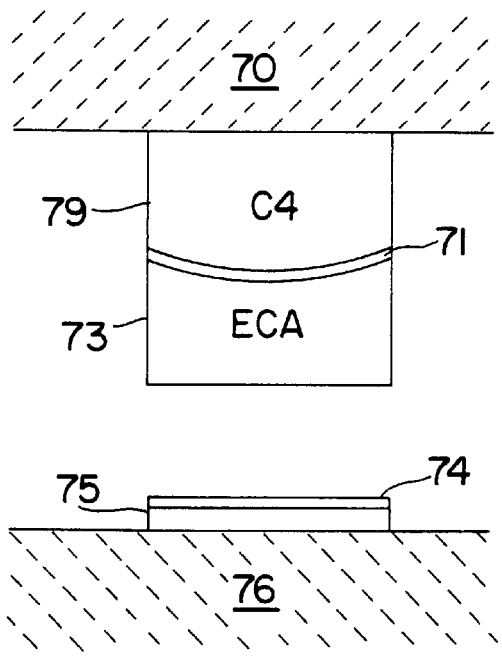
FIG. 10 illustrates a device according to a sixth embodiment of the present invention, including a test substrate having test pads used to electrically and mechanically engage an ECA material which is applied to a C4 ball on the wafer to be tested.

In FIG. 10, the wafer 70 is provided with standard C4 balls 79 having a thin precious metal layer 71. C4 balls 79 have ECA bumps 73 disposed on them. During testing, the ECA bumps 73 are brought into contact with the substrate metallizations or test pads 75, which are provided with a thin precious metal layer 74 and are formed on the test substrate 76.

Wafer-level tests for generation of known good dies present a challenge for both wire bond and C4 technologies (discussed in the "Background" section above). It is difficult to bring test probes into contact with the conductive metal pads of the wafer to test the die functions without damaging the metal pad surfaces and rending those surfaces unsuited for subsequent bonding to the circuit package. The process step of attaching C4 balls to either wire bond wafer pads or for flip-chip technology wafers risks damage to the balls. Wire bond wafer pads, which are normally aluminum, must be further processed to create a gold surface on the ball-limiting metallurgy (BLM) to accept deposit of the C4 balls. After testing, the C4 balls must be removed to allow for normal wire bonding. These added pre- and post-processing steps are cumbersome and expensive. In the case of C4 technology, the balls are often damaged during testing and must be reflowed again to reform their spherical shape for subsequent circuit packaging. The various embodiments of the method and device of the present invention simplify known good die testing procedures for both wire bond wafers and C4 wafers.

FIG. 11 shows another embodiment of the present invention in which the wafer 80 is provided with ECA bumps 83. Specifically, the ECA bumps 83 are applied to the chip pads 82 of wafer 80. A thin precious metal layer 81 is applied to the chip pads 82. The ECA bumps 83 may be applied using the photobumping process, and will typically have the preferred composition, described above. ECA bumps 83 may be plasma etched to increase their surface area at the microscopic level and to remove portions of the polymer, thereby exposing some of the conductive particles contained in the material and creating a dendritic form. After etching, the ECA bumps 83 are plated with a layer of palladium 84 to form a dendritic palladium layer.

Palladium test pads 85 are formed on the test substrate 86, which is preferably a glass ceramic carrier surface. Test substrate 86 and its test pads 85 act as test probes. Wafer 80 is brought into contact with test substrate 86 and dendritic palladium contacts are formed between the palladium test pads 85 and the palladium layer 84 on ECA bumps 83 of wafer 80. Known good die may be identified from subsequent tests.

When the wafer 80 to be tested is finished with aluminum wire bond pads, these pads are treated with zincate, nickel, and gold before applying the ECA bumps 83 to prepare the metal for bonding to the ECA material. After testing of the wafer 80 is completed, the ECA bumps 83 are stripped by wet processing with a solvent such as ethyl benzoate. The gold surface from the earlier wafer processing is then exposed. Wafer 80 is then diced and known good individual die may be bonded into packages using gold wire.

When the wafer 80 is a C4 bump wafer, ECA bumps 83 replace the C4 bumps, at least during testing. The ECA material is photobumped after the BLM (not shown) has been deposited on the chip pads 82 of wafer 80 but before application of the 97-3 lead-tin bump metallurgy. Instead, the ECA bumps are formed. After testing, the die can be diced and assembled to a chip carrier or board assembly in a circuit package using the ECA flip-chip attach assembly process. Alternatively, the ECA bumps 83 can be stripped using a wet process solvent such as ethyl benzoate. Wafer 80 can then be bumped using the 97-3 lead-tin standard bump metallurgy, diced, and picked, yielding the good die which can then be assembled using an appropriate C4 circuit package.

The method and device of the present invention eliminate several problems with conventional processes. First, the ECA bumps 83 are compliant to absorb the co-planarity tolerances of the solder bumps, test probes (which typically have platinum tips), and probe carriers upon mating of the probes to the bumps. Second, the palladium plating forms dendrites which penetrate into the test probe pads on the glass ceramic carrier to provide a consistently high-quality electrical contact with low contact resistance. Oxide formation on the bumps during conventional processes can cause wide variations in the electrical contact resistance between the probe and the solder. Finally, the processing for preparation of the wafers for packaging after testing consists of simple wet processing steps for wire bond wafers, no additional steps for wafers using the ECA bumps 83 for packaging interconnection, or simple wet processing followed by standard C4 application where C4 solder bumps are desired. Additional high-temperature processing may be required, during conventional processes, to prepare the tested wafers for subsequent circuit packaging.

Figure 13:
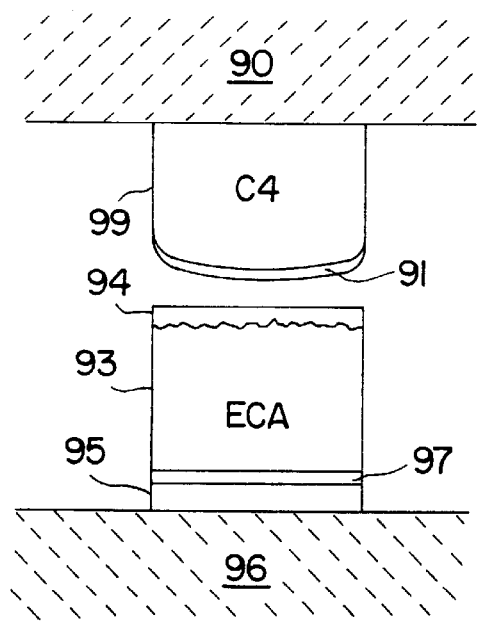
FIG. 13 illustrates a device according to a ninth embodiment of the present invention, including a test substrate having test pads on which are formed palladium dendrites atop an ECA material, with the dendrites used to electrically and mechanically engage the C4 balls of the wafer to be tested.

FIGS. 12 and 13 illustrate a device similar to that shown in FIG. 11. The main difference between the devices is that the ECA bumps 93, in FIGS. 12 and 13, are formed on the test substrate 96 rather than on the wafer 90. Test substrate 96 is a test probe comprised of a glass ceramic carrier and has test pads 95 which correspond with chip pads or contacts 92 on the target wafer 90 (in FIG. 12). The ECA bumps 93 may be formed on test pads 95 (directly on a precious metal layer 97) using the photobumping process. The ECA bumps 93 have a preferred tolerance of about 0.0005 inches.

The test substrate 96 with its ECA bumps 93 is exposed to plasma to etch away some of the polymer matrix of ECA bumps 93. The etching process exposes the conductive metal particles of the ECA bumps 93 and roughens the surface of ECA bumps 93, creating a high surface contact area. The ECA bumps are then selectively plated with a palladium layer 94. The resulting structure provides a test probe interface which is mechanically compliant—to accommodate tolerances of the probe carrier, ECA bump heights, and wafer contacts—and which is capable of forming a high-quality electrical interconnection due to palladium dendrite growth from the surface of ECA bumps 93 into the chip pads or contacts 92 (through thin precious metal layer 91) on the target wafer 90. When testing is complete, the interface can be easily separated and the test probe can be reused.

When the target wafer 90 is a wire bond wafer, as illustrated in FIG. 12, it will typically be provided with aluminum wire bond pads 92. These may be tested directly by bringing the mating test substrate 96 with palladium-treated ECA bumps 93 into intimate contact with the aluminum wire bond pads 92 with sufficient pressure to form a continuous electrical path between the test substrate 96 and the wafer 90. The silver-palladium-aluminum metals provide the electrical contact at the interface. The compliance of the ECA material accommodates the mechanical tolerances to allow the continuous electrical path to be formed. The fixturing pressure at the contact is such that the resiliency of the ECA material is retained and the aluminum surface of the wafer is not mechanically damaged. If a better electrical interface is required, wafer 90 can be further treated before testing with zincate, nickel, and gold to prepare the metal surface for bonding to the ECA-palladium interface. When testing is complete, the interface can be easily separated and the test probe reused. The wire bond wafer pads can be cleaned, if desired, and the wafer can proceed to normal subsequent processing such as dice and pick.

A target wafer 90 having C4 bumps 99, typically 97-3 lead-tin coated with a thin precious metal layer 91, is shown in FIG. 13. Such wafers 90 can also be tested according to the method of the present invention. The ECA-bumped test substrate 96 is brought into intimate contact with the solder-bumped wafer. Dendritic palladium contacts are formed between the palladium layer 94 of the ECA bumps is 93 and the C4 solder bumps 99 on wafer 90, allowing a continuous electrical path to form. The fixturing pressure at the contact is such that the resiliency of the ECA material is retained and solder bumps 99 on wafer 90 are not mechanically damaged. Wafer 90 may be cleaned after testing and the wafer can proceed to normal subsequent processing such as dicing, picking, and assembly.

Various structures are known in the art for applying a predetermined force to move the chip and the test substrate together and align the ECA material with the test pads. Such structures can also remove the force and separate the ECA material from the test pads. The person of ordinary skill in the art will also be familiar with various apparatus suitable for performing a known good die test. U.S. Pat. No. 5,420,520 illustrates several of these structures and apparatus and its teachings of those components are incorporated by reference.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A method of testing a semiconductor chip using a separable connection, comprising the steps of:

providing a semiconductor chip having contact pads located in an arrangement on a surface of the semiconductor chip;

placing an electrically conductive adhesive material and a precious metal layer on the contact pads, so that the precious metal layer is between the contact pads and the electrically conductive adhesive material;

providing a test substrate having conductive test pads located on a surface of the test substrate in a mirror image pattern corresponding to the arrangement of the contact pads;

moving the semiconductor chip and the test substrate together, aligning the electrically conductive adhesive with the test pads, and applying a predetermined force;

testing the semiconductor chip;

moving apart the semiconductor chip and the test substrate;

removing the electrically conductive adhesive material from the contact pads of the semiconductor chip.

2. The method of claim 1 in which the step of providing a test substrate further comprises adding a precious metal plating to the test pads.

3. The method of claim 1 wherein the test pads of the test substrate are precious metal.

4. The method of claim 1 in which the step of removing the electrically conductive adhesive material from the contact pads of the semiconductor chip involves dissolving the electrically conductive adhesive material with a solvent.

5. The method of claim 1 wherein the electrically conductive adhesive material is a polyimide-siloxane thermoplastic dissolved in an organic solvent with silver flakes mixed into the dissolved thermoplastic.

6. A device for testing a semiconductor chip having contact pads located in an arrangement on a surface of the semiconductor chip, the device comprising:

an electrically conductive adhesive material and a precious metal layer on the contact pads, so that the precious metal layer is between the contact pads and the electrically conductive adhesive material;

a test substrate having conductive test pads located on a surface of the test substrate in a mirror image pattern corresponding to the arrangement of the contact pads on the semiconductor chip; and a solvent dissolving the electrically conductive adhesive material after testing of the semiconductor chip and after the semiconductor chip and test substrate are moved apart, thereby removing the electrically conductive adhesive material from the contact pads of the semiconductor chip.

7. The test device of claim 6 further comprising precious metal plating on the test pads of the test substrate.

8. The test device of claim 6 wherein the test pads of the test substrate are palladium.

9. The test device of claim 6 wherein the electrically conductive adhesive material is a polyimide-siloxane thermoplastic dissolved in an organic solvent with silver flakes mixed into the dissolved thermoplastic.

* * * * *